United States Patent [19]

Cricchi et al.

[11] 3,925,804

[45] Dec. 9, 1975

[54] STRUCTURE OF AND THE METHOD OF PROCESSING A SEMICONDUCTOR MATRIX OR MNOS MEMORY ELEMENTS

[75] Inventors: James Ronald Cricchi, Baltimore; Barry W. Ruehling, Belair, both of Md.

[73] Assignee: Westinghouse Electric Corporation, Pittsburgh, Pa.

[22] Filed: Jan. 29, 1974

[21] Appl. No.: 437,650

[52] U.S. Cl. .......................... 357/23; 357/40; 357/41; 357/52; 357/54

[51] Int. Cl.² .................... H01L 29/78; H01L 29/34

[58] Field of Search .............. 357/41, 40, 52, 54, 23

[56] References Cited

UNITED STATES PATENTS

| | | | |
|---|---|---|---|
| 3,602,782 | 8/1971 | Klein | 317/235 R |
| 3,646,527 | 2/1972 | Wada | 340/173 |
| 3,668,484 | 6/1972 | Greig | 317/234 R |

OTHER PUBLICATIONS

Ross et al., R.C.A. Review, Sept. 1970, pp. 467–478.

Cricchi et al., Electrochemical Soc. Meeting, Oct. 8–13, 1973, "Effect of $Si_3N_4$ Deposition Rate on Oxide–Nitride Interface Charge".

Cullen et al., R.C.A. Review, June 1970, p. 353.

*Primary Examiner*—Martin H. Edlow
*Attorney, Agent, or Firm*—J. B. Hinson

[57] ABSTRACT

The structure of and the method of processing is disclosed for providing a MNOS element comprised of diverse regions within a semiconductive member. A first silicon oxide layer is disposed to cover a first portion of the semiconductive substrate, other than that in which the MNOS element is formed. A second silicon oxide layer is disposed to cover a second portion of the semiconductive member in which the MNOS element is formed. A conductive element is connected to one of the MNOS regions and overlies the first portion of the member. A first layer of a nitride such as $Si_3N_4$ is deposited at a rate in the range of 40 to 60 A/-minute to cover the silicon oxide layer, whereby a nitride-oxide interface charge of a magnitude and polarity is established to inhibit the formation of a parasitic region within the semiconductive member, due to the application of a voltage signal to the conductive element.

In a further aspect, either or both memory and non-memory MNOS elements may be fabricated in a manner to include drain and source regions spaced from each other with its second silicon oxide layer covering the channel formed therebetween, and a gate electrode disposed thereon. In the formation of a memory MNOS element, the second oxide layer covering the second portion of the member is reduced, e.g. by etching, to a thickness in the order of 7 to 9 A. Next, in the fabrication of both memory and non-memory MNOS elements, a second nitride layer is deposited at a rate in the order of 75 to 150 A, whereby the nitride-oxide interface charge is minimized. A plurality of such memory MNOS elements may be formed into a matrix, wherein the row and column conductors are insulated from each other. The deposition of the first nitride layer at the rate specified above inhibits the formation of parasitic regions beneath the row and column conductors. Further, memory and non-memory MNOS elements may be fabricated upon a common semiconductive substrate by simplified fabrication techniques. In particular, the second deposition of silicon nitride is carried out at a rate in the order of 100 A/minute, whereby a minimum nitride-oxide interface charge is established to ensure the effective operation of the non-memory MNOS element and to increase the memory hysteresis window of the memory MNOS element.

15 Claims, 13 Drawing Figures

STRUCTURE OF AND THE METHOD OF PROCESSING A SEMICONDUCTOR MATRIX OR MNOS MEMORY ELEMENTS

CROSS-REFERENCE TO RELATED APPLICATIONS

Reference is made to the following related patent applications, each of which is assigned to the present Assignee:

U.S. Pat. No. 3,836,894 entitled "MNOS/SOS RAM With Symmetrical Charge Enhancement Read and Write Modes," filed Jan. 22, 1974 in the name of J. R. Cricchi;

application Ser. No. 219,463, entitled "Enhancement Limited MNOS Memory Devices," filed Jan. 20, 1972 in the name of J. R. Cricchi; and the subject matter of application Ser. No. 437,649, entitled "Block Oriented Random Access Memory," filed concurrently herewith on Jan. 29, 1974 in the names of J. R. Cricchi and Franklyn C. Blaha, is specifically incorporated herein by reference.

BACKGROUND OF THE INVENTION

1. Field of the Invention

This invention relates generally to the methods and structures of providing semiconductor devices and more particularly to such structure and method for providing a semiconductive matrix of a plurality of MNOS transistor-memory elements disposed in rows and columns on a semiconductive substrate.

2. Description of the Prior Art

A well-known transistor memory element currently utilized in semiconductor memories is the metal-nitride-oxide semiconductor (NMOS) transistor. This element is a standard insulated gate field effect transistor in which the silicon dioxide gate insulator is replaced by a double insulator, typically a layer of silicon dioxide nearest the silicon substrate and a layer of silicon nitride over the silicone dioxide. Memory is obtained in an MNOS element by electrically reversible tunnelling of charge from the silicon to "traps" of electrical charge at the silicon dioxide-silicon nitride interface. The threshold voltage or the voltage applied to the gate which initiates current flow between the drain and source electrodes is influenced by the charge state of the traps. These traps are conventionally charged and discharged by the application of a sufficiently large polarizing voltage of predetermined polarity coupled across the gate electrode and substrate. Information is read out of the device by way of the source and drain electrodes.

In the above-identified application entitled, "Block Oriented Random Access Memory," a plurality of such MNOS transistors is used as memory elements in a matrix array formed on a common semiconductive substrate. The plurality of MNOS memory elements is disposed in rows and columns of the matrix. In particular, each of a first plurality of conductive strips is disposed along a matrix row to interconnect to the gate electrodes of each of the memory elements of that row, and each of a second plurality of pairs of conductive strips is disposed along a column of the matrix. One strip of the pair is connected to each source of the MNOS memory elements disposed in that column, while the other electrode of the pair is connected to the drain electrode of these MNOS memory elements.

In the manufacture of such memory arrays of MNOS memory elements, insulating layers, typically of silicon dioxide, are interposed between the conductive strips of the rows and columns of the matrix, and the semiconductive substrate in which the regions of each of the MNOS memory elements is formed. The conductive strips are formed substantially parallel with the surface of the semiconductive substrate and tend to form undesired, parasitic regions within the semiconductive substrate, thereby tending to decrease the isolation (or increase the parasitic surface current) between adjacent MNOS memory elements of the memory array.

In order to prevent the formation of such parasitic regions and to increase the level of the parasitic threshold voltage of such elements, the prior art suggests increasing the thickness of the insulating layer disposed between the conductive strips and the semiconductive substrate, to a dimension in the order of 20 KA to 25 KA. However, the increased insulating layer thickness creates a problem in the manufacture of such semiconductor devices and in particular in the manufacture of such memory arrays. In particular, it is necessary to open windows or via's within the insulating layers whereby electrical connection may be made between one of the conductive strips and a portion or region formed within the semiconductive substrate. In such memory arrays as described, it is necessary to direct the first and second pluralities of conductive strips at right angles to each other, whereby the first and second pluralities of conductive strips must be insulated from each other. As a result, the uppermost plurality of conductive strips is insulated by at least two insulating layers from the substrate, the first interposed between the first plurality of conductive strips and the substrate, and the second interposed between the first and second pluralities of conductive strips. As a result, in the formation of the conductive strips as by depositing a suitable metal such as aluminum or an alloy of aluminum and copper, it becomes difficult to ensure that the deposited metal will fill each contact window. Due to the increased step height of the relatively thick insulating layer required to reduce parasitic effects, electrical interconnections may not be formed between the semiconductive regions and the conductive strips.

SUMMARY OF THE INVENTION

It is therefore an object of this invention to reduce parasitic effects within semiconductive devices.

It is a further object of this invention to provide new and improved semiconductive structures and in particular matrix arrays of semiconductive devices such as MNOS FET's, wherein the thickness of the insulating layers separating the matrix row and column conductive strips from the semiconductive substrate is reduced and the reliability of the electrical interconnections between the conductive strips and the semiconductive regions is assured.

It is a further object of this invention to provide a simplified method of fabricating memory and non-memory MNOS elements onto a common substrate.

These and other objects are accomplished in accordance with teachings of this invention by providing the structure and the method of fabricating such a structure, wherein at least one MNOS element comprised of diverse regions, is formed within a semiconductive member. In particular, a first silicon oxide layer is disposed to cover a first portion of the semiconductive member, other than that in which the MNOS element is formed. A second silicon oxide layer is disposed to cover that second portion of the semiconductive member in which the MNOS element is formed. A first conductive element is disposed into intimate electrical contact with one of the MNOS regions, and overlies the first portion of the semiconductive member. A first layer of a nitride such as $Si_3 N_4$ is disposed to cover the first silicon oxide layer, whereby a nitride-oxide interface charge of a magnitude and polarity is established to inhibit the formation of a parasitic region within the semiconductive member, due to the application of a voltage signal to the conductive element.

In one illustrative embodiment of this invention, either or both memory and non-memory MNOS elements may be fabricated in a manner to include drain and source regions spaced from each other with its second silicon oxide layer covering the channel formed therebetween, and a gate electrode disposed thereon. In the formation of a memory MNOS element, the oxide layer covering the first portion is reduced, e.g. by etching, to a thickness in the order of 7 to 9 A. Next, in the fabrication of both memory and non-memory elements, a second nitride layer is deposited at a rate in the order of 75 to 150 A, whereby the nitride-oxide interface charge is minimized.

In a further embodiment of this invention, a plurality of the memory MNOS elements as described above may be disposed in the form of a matrix comprising columns and rows. In order to make electrical contact to the drain and source regions of the MNOS memory elements, first and second pluralities of conductive strips are disposed along the rows and columns. The first and second pluralities of conductive strips are insulated from each other, whereby the conductive strips may be disposed substantially perpendicular to each other. The first nitride layer is deposited at a rate in the range of 40 to 60 A/minute, as specified above, to form a nitride-oxide interface charge, whereby parasitic regions are inhibited from forming beneath the first and second pluralities of conductive strips. Further, due to the presence of this nitride-oxide interface charge, the deposition of the conductive strips is effected over insulating layers of reduced thicknesses, whereby the electrical interconnection between the conductive strips and the regions of the MNOS elements, by metal deposition, is improved.

In a further aspect of this invention, memory and nonmemory MNOS elements may be fabricated upon a common semiconductive substrate by simplified fabrication techniques. In particular, the second deposition of silicon nitride is carried out at a rate in the order of 100 A/minute, whereby a minimum nitride-oxide interface charge is established to ensure the effective operation of the nonmemory MNOS element and the memory hysteresis window of the memory MNOS element is increased.

BRIEF DESCRIPTION OF THE DRAWINGS

These and other objects and advantages of the present invention will become more apparent by referring to the following detailed description and accompanying drawings, in which.

DESCRIPTION OF THE PREFERRED EMBODIMENTS

Figure 1A:
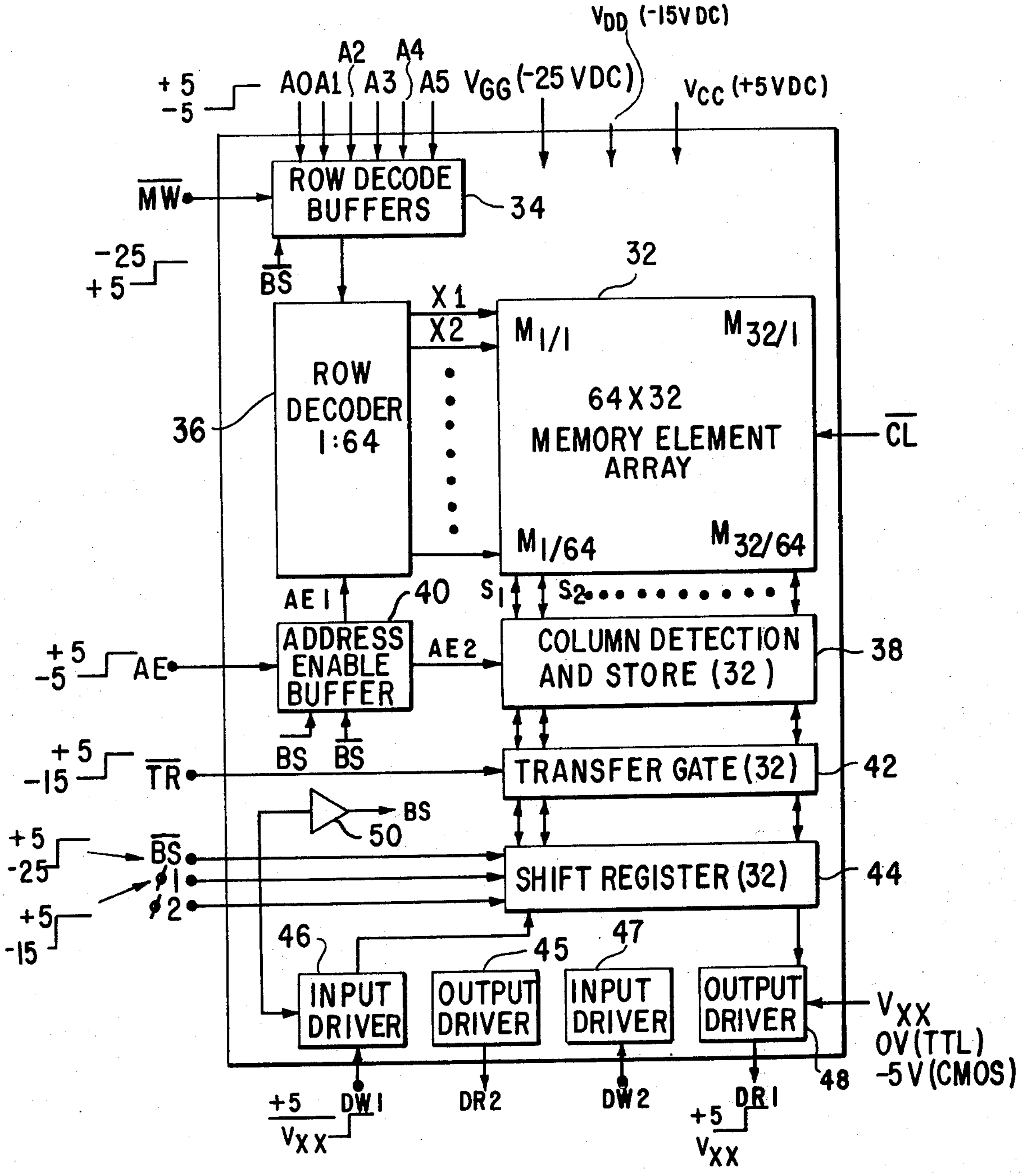
FIGS. 1A and 1B are schematic diagrams of a semiconductive assembly upon which is formed a matrix of MNOS FET's in accordance with the teachings of this invention.
Figure 1B:
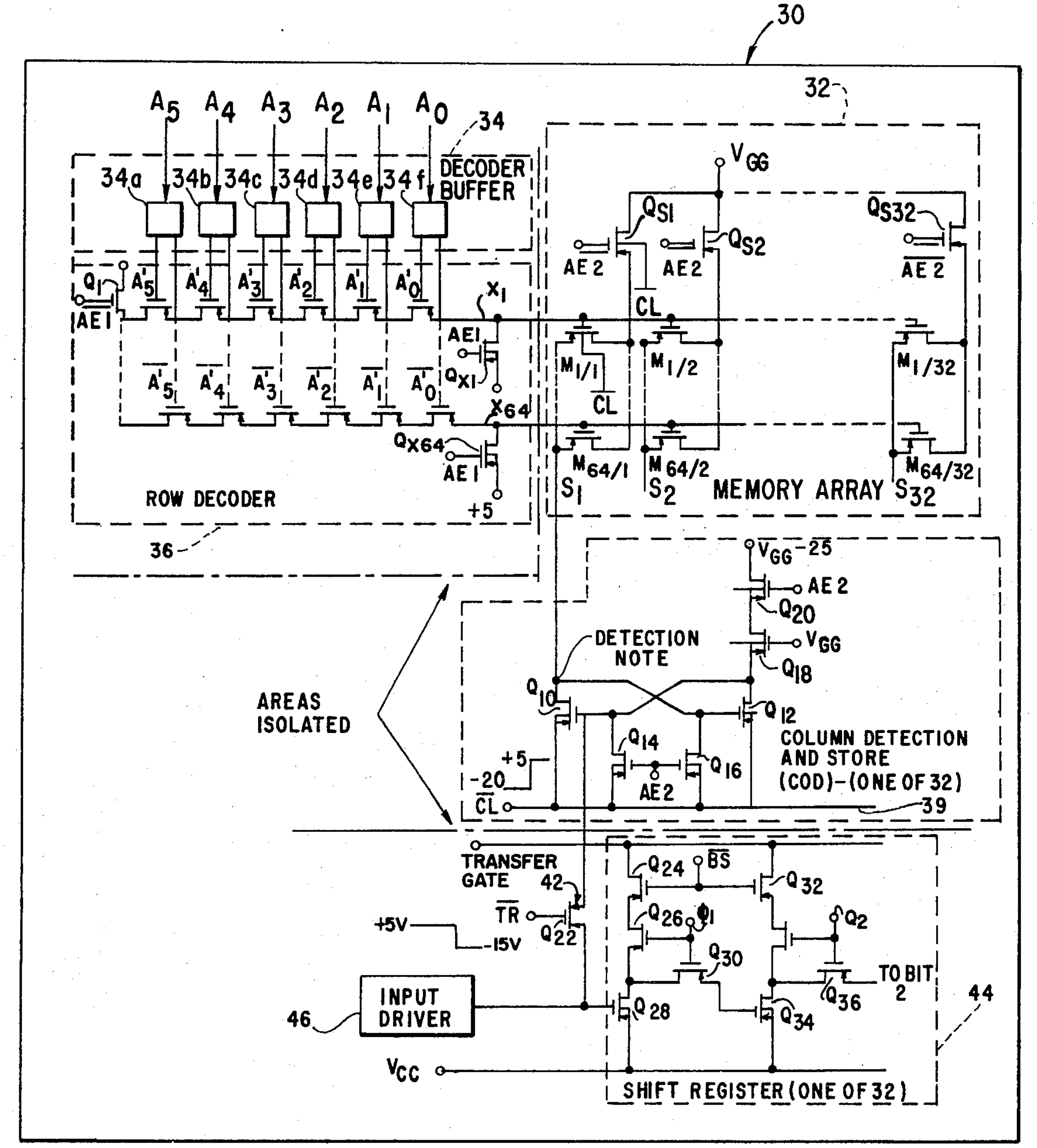
Figure 2:
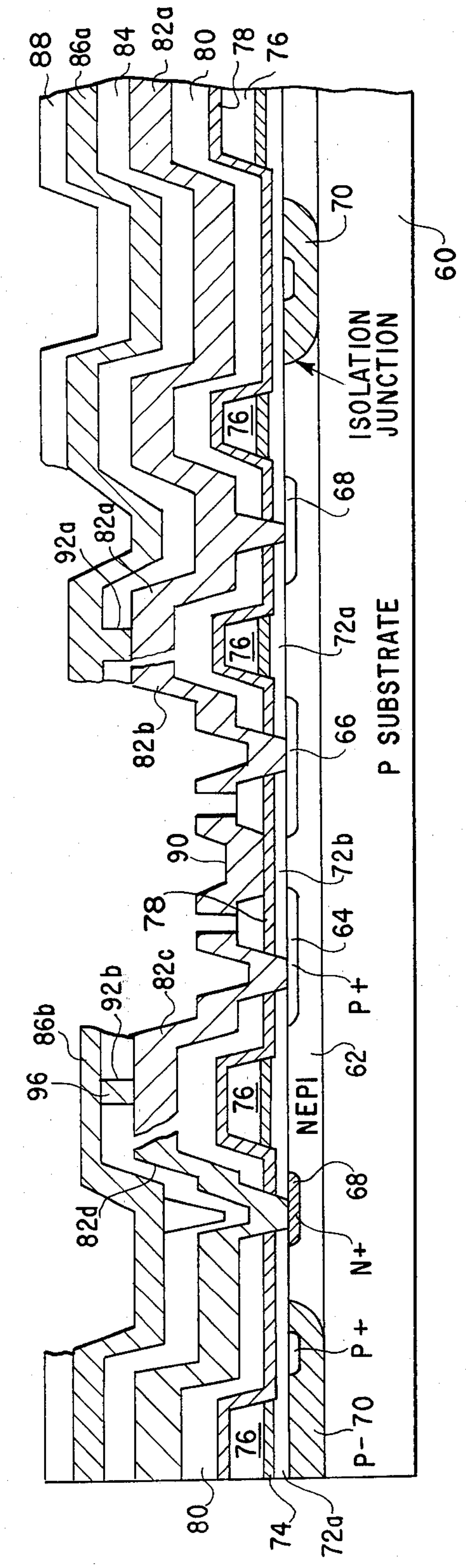
FIG. 2 is a cross-sectional view of an MNOS FET device incorporating the semiconductor structure of and fabricated by the method of this invention.

In order to fully appreciate the problems associated with a matrix of memory elements such as MNOS FET's, a brief description will be given of such a memory assembly with respect to FIGS. 1A and 1B; such memory assembly is fully described in the above-referenced application entitled, "Block Oriented Random Access Memory," such description being incorporated herein specifically by reference. In FIG. 1A there is shown a memory assembly 30 including a memory matrix array 32 comprised of a plurality of memory elements taking the form of the MNOS transistor as shown in FIG. 2, disposed in columns and rows as shown more particularly in FIG. 1B. Illustratively as shown in FIGS. 1A and 1B, the memory elements designated by the letter *m*, are disposed in an array 32 columns-by-64 rows, thus comprising 2,048 MNOS memory elements, As explained in the above-identified application Ser. No. 437,649, the memory assembly 30 is incorporated into a BORAM memory system comprising a plurality of blocks of such assemblies 30. In order to randomly access one of the blocks (including a plurality of the memory assemblies 30), a block-select signal $\overline{BS}$ is generated and applied as shown in FIG. 1A to an input driver circuit 46. As a result, the input driver 46 is enabled to permit the application of binary data-write signals DW, through the input driver circuit 46 to a sequential or serial storage means illustratively taking the form of a shift register 44. The shift register 44 includes 32 stages corresponding to the 32 columns of the memory matrix array 32. A clock signal of a frequency $f_c$ (not shown) is applied to the input driver circuit 46 to permit the data-write signals to be loaded into the register 44 at the clock frequency $f_c$. Further, shift signals of phase 1 and phase 2 are applied to the shift register 44 to permit the serial entry and shift of the data-write signals from stage to stage within the shift register 44 of the data-write signals DW. At the end of 32 clock periods, the input data, comprising the data-write signals DW, are placed in each of the 32 stages of the shift register and are ready to be transferred through a transfer gate 42 and a column detection and store circuit 38 to the columns of the memory matrix array 32. The transfer gate circuit 42 transfers, in response to a transfer signal $\overline{TR}$, the 32 bits of data as stored in the shift register 44 to the column detection and store circuit 38 to be stored for a period of time corresponding to 32 times the clock period. As a result, a multiplexing function is contemplated to lower the speed at which the rows need to be addressed and thus minimize the power required and the size of the assembly 30. Given an input data rate of f, data transfer between the column detection and store circuit 38 and the shift register 44 occurs at a rate of $f/32$. Thus, the rows are decoded at $f/32$, and all of the memory elements in a row are electrically written or read out at $f/32$.

To permit the reading or writing of the memory elements upon one of the rows $X_1$ to $X_{64}$ of the memory matrix array 32, address signals $A_0$ to $A_5$ are applied to row decode buffers 34. The stored addresses in turn are applied to a row decoder 36, generally shown in FIG. 1A, and shown in detail in FIG. 1B. The row decoder 36 generally takes the form of a decode tree and responds to the addresses $A_0$ to $A_5$ to selectively enable or energize one of the rows $X_1$ to $X_{64}$, whereby data may be written onto or read from the memory elements within the selected row.

With respect to FIG. 1B, there is shown a memory assembly 30 upon which there is disposed in integrated form the row decoder 36, the memory array 32, the column detection and store circuit 38, the input driver circuit 46 and the shift register 44, as explained briefly above. For a detailed description of the operation and the circuitry of the circuits shown in FIG. 1B, particular reference is made to the above-identified, co-pending application entitled, "Block Oriented Random Access Memory." The memory array 32 is comprised illustratively of 64 rows $X_1$ to $X_{64}$, each connected to the gate electrodes of those MNOS memory elements disposed in that row. Further, there are 32 columns $S_1$ to $S_{32}$, each comprised of a pair of conductive strips, the first conductive strip being connected to the source of the column memory elements and the other conductive strip being connected to the drain electrodes of those MNOS memory elements in that column. Further, a plurality of clamping switches, e.g. FET's, $Q_{S1}$ to $Q_{S32}$, interconnect the second strips of the columns to a biasing voltage $V_{GG}$. Similarly, a plurality of clamping transistors $Q_{XI}$ to $Q_{X64}$ serves to clamp the row conductors $X_1$ to $X_{64}$ to a biasing voltage $V_{CC}$.

In FIG. 2, there is shown a cross-sectional view of an MNOS field effect trnsistor (FET) of the general type that may be incorporated into the memory assembly 30 as either one of the FET memory elements *m* or as one of the other FET non-memory elements, e.g. one of the row decoder FET's A'. The order of the layers as shown in FIG. 2 is accurate; however, the placement of the conductive strips 82 and 86, and the junctions 70 are shown for the purposes of illustration and do not correspond to the actual arrangement of the elements within the memory assembly 30. For example, the isolation junctions and regions 70 are interposed between the row decoder 36 and the memory array 32, as shown in FIG. 1B. The arrangement of the conductive strips 82 and 86 is shown more completely in FIG. 3. The MNOS FET as shown in FIG. 2 includes a substrate 60 having a crystal orientation <100> doped with a P-type dopant such as Boron to a density of $N_A = 10^{14}$ to $10^{15}$ cm$^-3$, whereby a resistivity $\rho$ of 10 to 40 ohms-cm is provided. An N-type epitaxial layer 62, doped with phosphorous to a concentration $N_D \approx 10^{15}$ cm$^{-3}$, is grown on a surface of the P-type substrate 60 and P-type regions 64 and 66 are formed therein to provide the source and drain regions of the MNOS FET. The portion of the epitaxial layer 62 in which the regions 64 and 66 are formed, is termed herein as the second portion. Further, isolation regions 70 also are diffused within the epitaxial layer 62 and are doped with a P-type material, whereby junction-isolation is achieved between the memory array 32 and the adjacent drive and buffer circuits, as shown in FIG. 1B. N+ type regions 68 are also diffused within the upper surface of the epitaxial layer 62 to provide contact between the epitaxial layer 62 and the electrical conductors, to be described.

Figure 4A:
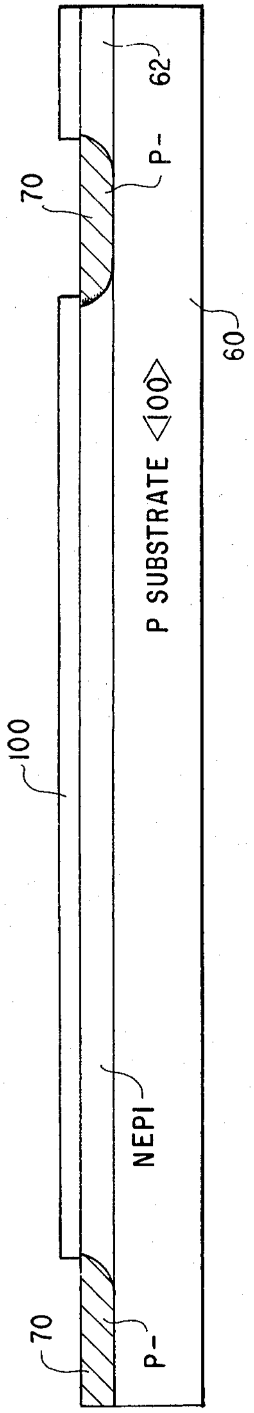
FIGS. 4A to 4C show the various steps in the fabrication of the MNOS FET device shown in FIG. 2.
Figure 4B:
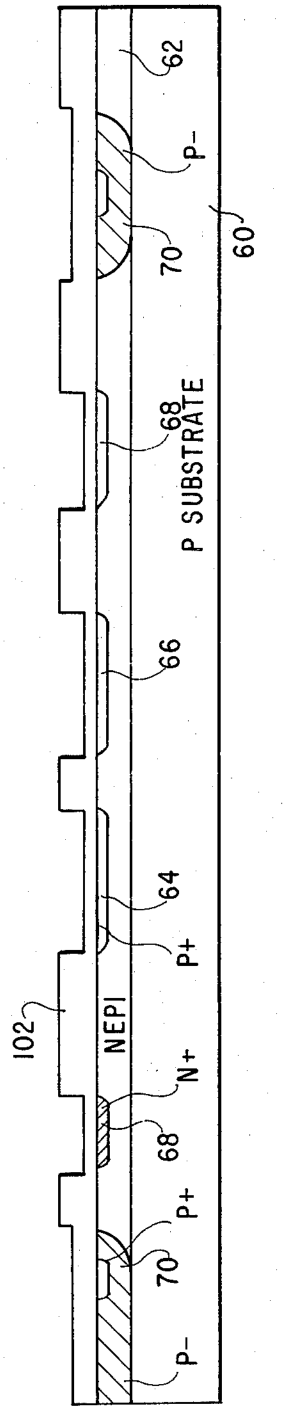
Figure 4C:
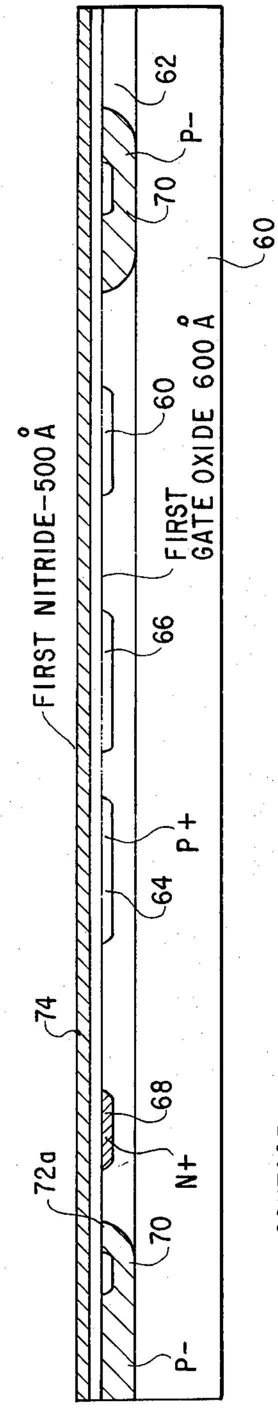
Figure 4D:
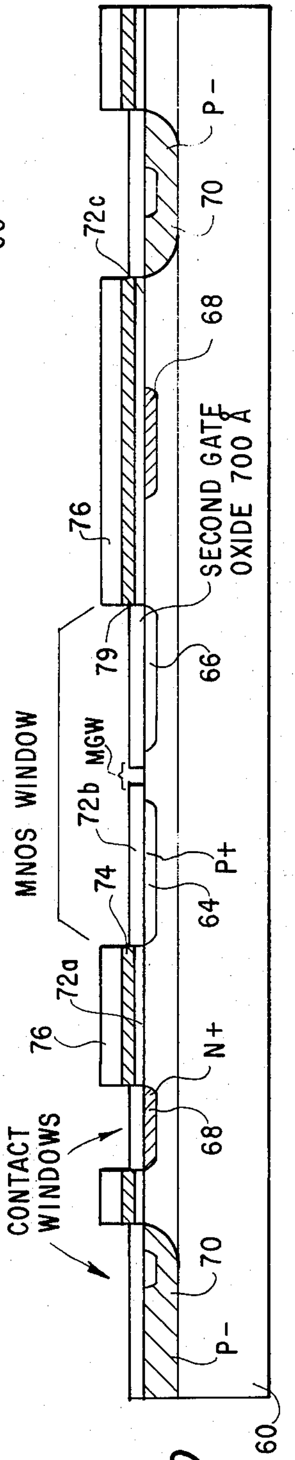

An insulating layer 72 is disposed upon the upper surface of the P-type substrate 60; in particular a second layer portion **72*b* is disposed over the second portion of the epitaxial layer 62 corresponding to the MNOS window as shown in FIG. 4D, while a first layer 72*a* is disposed over the remaining or first portion of the layer 62. Significantly, a first layer 74 of a suitable nitride such as $Si_3N_4$ is disposed over the first oxide layer 72*a* in the range of 40 to 60 A to form a nitride-oxide interface charge of a magnitude and polarity to inhibit the formation of parasitic regions between adjacent MNOS elements. As a result, high parasitic voltages are established with insulating layers of significantly less thickness than those of the prior art. In particular, parasitic threshold voltages in excess of −40 V have been achieved with the use of <100> silicon doped to a densitiy $N_D$ of approximately $10^{15}$ cm$^{-3}$ and having an effective thickness $X_{ox}$ of approximately 15 KA. As will be explained later with respect to FIG. 5, a nitride-oxide interface charge $+QI/q$ of in excess of $10^{12}$ cm$^{-2}$ has been achieved. As will be explained later, the first nitride layer 74 is disposed to cover only those portions of the layer 62 in which the MNOS elements are not formed, i.e. the first layer portion 72*a* as defined above. Next, a further silicon oxide layer 76 is formed, FIG. 2 showing only isolated portions thereof, and a second nitride layer 78 is disposed across the isolated portions of the insulating layer 76 and the first nitride layer 74. The second nitride layer 78, unlike the first nitride layer 74, covers the second portion of the surface of the epitaxial layer 62 beneath which the MNOS device is formed. As will be explained later with respect to FIG. 5, the second nitride layer 78 is deposited at a critical rate in the range of 75 to 150 A/minute to ensure a minimum nitride-oxide interface charge so that the normal operation of the MNOS FET element is not effected, i.e. it is not desired to inhibit the formation of a channel between the source and drain regions 64 and 66** of the MOS FET.

Further, a first set of electrically-conductive strips 82, made of a suitable conductive material such as an alloy of Cu-Al, is disposed at a first level across a further, insulating layer 80 to make contact to the epitaxial region through the N+ region 68, the drain region 66 and the source region 64. In particular, conductive strips 82a and 82d provide electrical connection to the epitaxial layer 62 through the N+ regions 68. Likewise disposed at the first level, as shown in FIG. 2, conductive strips **82*b* and 82*c* provide electrical connection through suitable windows in the second nitride layer 78 and the second insulating layer 72*b*, to the source and drain regions, 66 and 68 respectively. Further, an electrode 90 is disposed through a window within the insulating layer 80** to provide a gate contact whereby the formation of a channel may be selectively controlled between the source and drain electrodes, as is well-known in the art.

In that illustrative embodiment where an MNOS FET is used in a memory matrix as shown in FIG. 1B, the conductive strips corresponding to the rows and columns of the matrix, are insulated from each other and are disposed to cross over each other, thus necessitating a second set or plurality of electrically conductive strips. As shown in FIG. 2, a further insulating layer 84 is disposed across the first set of electrically conductive strips 82, and a second set of electrically conductive strips 86*a* and 86*b* is disposed at a second level. Illustratively, to permit interconnection with external signal sources, via's 92*a* and 92*b* are provided through the insulating layer 84 so that an electrical connection may be made between the second electrically conductive strip 86*a* and the first electrically conductive strip 82*a*, and between the strips 82*b* and 82*c*. In this manner, the signals to be applied to the source and drain electrodes of the MNOS FET may be applied to the conductive strips 86*b* and 86*a*, respectively, without interfering with the signals applied to the gate region through the conductive strip 90, passing beneath the aforementioned conductive strips and being insulated therefrom. As illustrated in FIG. 2, there are two conductive strips 82*a* and 82*b* disposed at the first level but laterally spaced from each other to provide insulating isolation therebetween. In this manner, electrical signals may be applied to both the epitaxial layer 62 and the drain region 66. Further, electrically conductive strips 82*d* and 82*c* are likewise laterally spaced and insulated from each other. Finally, an insulating covering or layer 88 is disposed upon the conductive strips 86 to isolate the various layers within the assembly from the environment.

Figure 3:
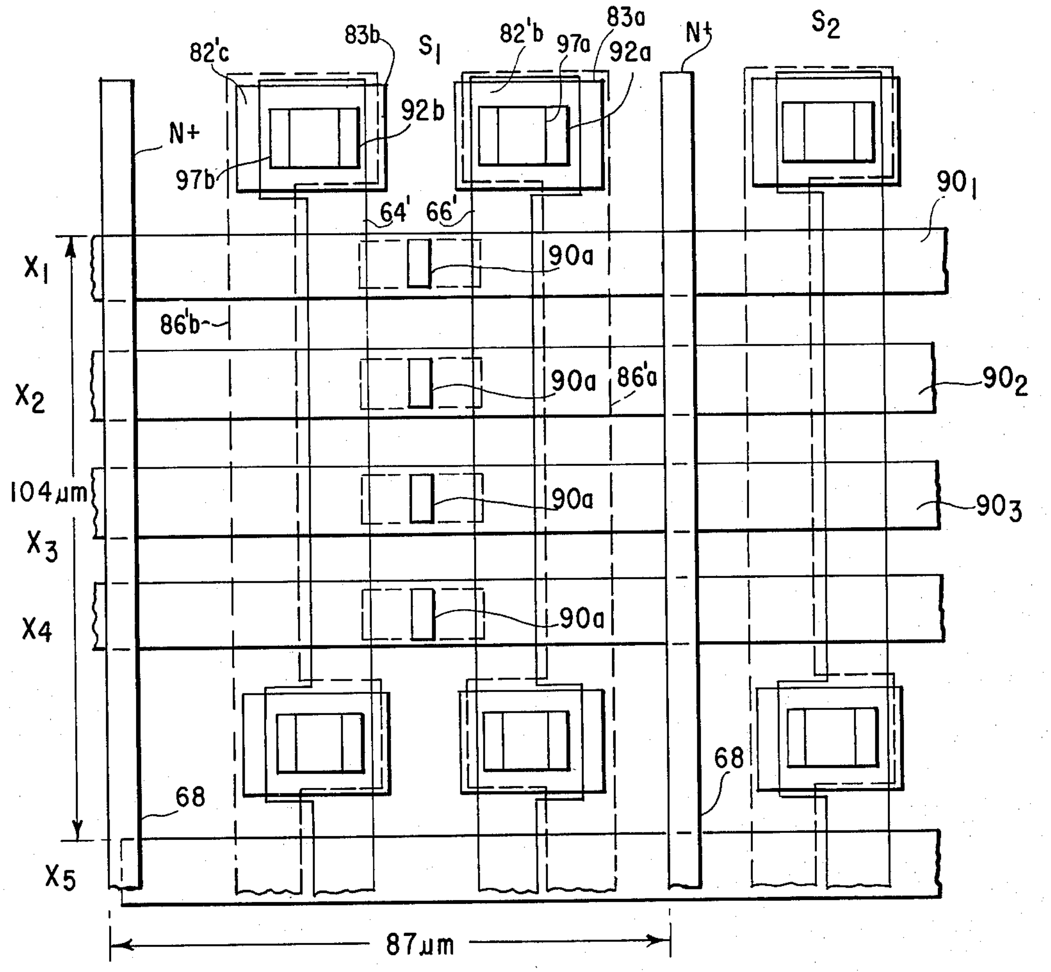
FIG. 3 is a plan view showing the orientation of the various conductive strips disposed at right angles with each other in a matrix, to interconnect the MNOS FET devices as shown in FIG. 2.

In FIG. 3, there is shown an illustrative embodiment whereby an MNOS FET similar to that shown in FIG. 2 is incorporated into a memory matrix 32 comprised of a plurality of rows $X_1$ to $X_N$ and columns $S_1$ to $S_N$ disposed at right angles so as to intersect with each other. A heavily doped region 68 is interposed between the column $S_1$ of MNOS FET memory elements $M_{1/1}$ to $M_{1/N}$ and the adjacent column $S_2$ of memory elements to reduce the accumulative impedance presented by the substrate 60 to the memory elements. It is noted that the representation of FIG. 3 is incomplete, for the sake of clarity, in that the substrate and various insulating layers are not represented; rather, FIG. 3 shows the layout of the electrically conductive strips forming the rows and conductors, the common source and drain regions 64′ and 66′ and the manner in which electrical contact is made therethrough to the source and drain regions of each of the FET's forming the memory elements *m*. A first plurality of conductive strips $90_1$ to $90_N$ is disposed along the corresponding rows of the matrix 32, whereby an electrical connection may be made from one of the strips 90 through its corresponding contact 90*a* to that portion of the second nitride insulating layer 78 disposed immediately above the channel between the source and drain regions, as shown in FIG. 3.

As shown in FIG. 3, the source and drain regions are formed within the epitaxial layer 62 as common regions 64′ and 66′ extending along the length of the column in which the corresponding memory elements are disposed. In particular, each of the memory elements $M_{1/1}$ to $M_{1/4}$ of column $S_1$ has separate gate electrodes 90*a* as shown in FIG. 3, and have their source and drain regions formed respectively as a part of the common source region 64′ and the common drain region 66′. In order to make electrical contact to each of the source and drain regions of the memory elements, a second plurality of pairs of electrically conductive strips or elements 86′ is disposed along the columns $S_1$ to $S_{32}$ of the matrix, substantially perpendicular to the row conductive strips 90. Further, as illustrated in FIG. 2, the first plurality of conductive strips 90 is disposed to extend beneath the second plurality of conductive strips 86 and is insulated therefrom by the insulating layer 84. In order to make electrical contact with the common source and drain regions 64′ and 66′, ohmic contacts 97*b* and 97*a* are formed thereon, respectively, as shown in FIG. 3. As shown in FIG. 3, windows 83*b* and 83*a* are provided through the insulating layers 72*b* and 78, whereby the electrically conductive elements 82′*c* and 82′*b* are disposed therethrough to make intimate electrical contact with the ohmic contacts 97*b* and 97*a* associated with the source and drain regions 64′ and 66′, respectively. In order to provide a space between the first and second pluralities of conductive strips 90 and 86′, the further insulating layer 84 is disposed over the conductive strips or elements 82′ and 90. As shown in FIGS. 2 and 3, via's 92*b* and 92*a* are formed through the insulating layer 84 and electrical interconnecting means or elements 96 are disposed therein, whereby electrical connection is made between the conductive elements 82′*c* and 82′*b*, and the conductive strips 86*b*′ and 86*a*′, respectively. As shown in FIG. 3, electrical connections between the first and second pluralities of conductive elements through the plurality of insulating layers, is not made for each memory element *m*, but rather for a selected, lesser number thereof, e.g. four. In this manner, the method of fabricating the memory matrix is simplified, and further, the density with which the MNOS memory elements may be disposed upon the common substrate is increased.

An illustrative method of fabricating the MNOS FET device as shown in FIG. 2, will now be explained with regard to FIGS. 4A to 4G. In FIG. 4A, the substrate 60 is provided of <100> oriented P-type silicon having a resistivity $\rho$ in the order of 10 to 40 ohms-cm and doped with a P-type impurity such as Boron to a density of $N_A = 10^{14}$ $10^{15}$ $cm^{-3}$. An N-type epitaxial layer 62 is first grown on the P-type substrate 60 to a depth of $X_j = 10\mu$. The epitaxial layer 62 is doped with arsenic (As) or phosphorus (preferred) to a density of $N_D = 10^{15}$ $cm^{-3}$ to provide a resistivity of $\rho = 6$ ohms-cm. Thereafter, a thermal oxide layer 100 is grown to a thickness of 6 KA in an atmosphere $O_2$ at a temperature in the order of 1,000°C to 1,100°C. A first mask is placed over the surface of the oxide layer 100 to provide a window through which diffusions of a P-type dopant are carried out at a temperature in the order of 1,200′′C for a period of ten hours to form isolation regions 70 to a depth of $X_j > 10\mu$, with a residual oxide covering 102 of a thickness $X_{ox} = 6$ KA.

With regard to FIG. 4B, a second mask is deposited next upon the oxide layer 102 for forming N+ contact region 68. In particular, a suitable N-type dopant such as phosphorous is driven through the windows formed in the second mask to a depth $X_j = 1\mu$ and suitably oxidized at a temperature in the order of 1,000°C. The region 68 so formed has a resistivity $\rho_S < 15$ ohms per square. A protective oxide layer (not shown) of a depth $X_{ox}$ in the order of 3 KA is formed. Next, a third mask is laid down and windows etched therein through which a suitable P-type dopant such as Boron is diffused at a temperature in the order of 1,000°C to form the source and drain regions 64 and 66 to a depth of $X_j = 1\mu$. The resultant source and drain regions 64 and 66 have a resistivity $\rho_S$ of approximately 125 ohms per square and a protective oxide layer (not shown) having a thickness $X_{ox}$ in the order of 3 KA is formed thereover.

With reference to FIG. 4C, after removing the protective oxide layer and performing gate cleaning procedures, the oxide layer 72*a* is grown at a temperature of 500°C in an atmosphere of $O_2$, as will be explained in detail later. Then, the first nitride ($Si_3N_4$) layer 74 is deposited to a thickness of $X_N$ = 500 A at the critical rate of 40 A/minute (within ranges of 40 to 60 A/minute and in excess of 200 A/minute) at a temperature of 750°C, whereby a nitride-oxide interface charge $N_I(cm)^2$ in excess of $+10^{12}$ is provided (see FIG. 5). As will be explained in detail later, the resultant positive, nitride-oxide interface charge prevents the formation of a corresponding positive channel or parasitic region within those portions of the N-type epitaxial layer 62 underlying the various conductive strips 82 and 86. In an alternative embodiment of this invention, it is contemplated that a layer of aluminum oxide could be deposited in place of the nitirde layers 74 and 78, where the layer 62 is of a P-type conductivity. In such an embodiment, the aluminum oxide layer would establish a negative interface charge, thereby inhibiting the formation of a negative channel or parasitic region within the P-type layer.

Further, with respect to FIG. 4D, the oxide layer 76 is deposited by the pyralytic decomposition of silane ($SiH_4$) in oxygen at a temperature in the order of 500°C to a thickness of $X_{ox}$ = 7 KA, and thereafter is densified in steam for 60 minutes at a temperature in the order of 1,000°C. Then, the fourth mask is laid down, and the MNOS and contact windows are formed therein, through which a second or gate oxide layer 72*b* is grown to a thickness $X_{ox}$ = 400 A - 1,400 A at a temperature of approximately 1,000°C. The first layer 72*a* is removed in the region of the MNOS device, in order that a new or second oxide layer 72*b* may be grown that does not have the contamination created by the previous processing, as described above; the performance of either a memory or non-memory MNOS element is effected by the presence of such contaminants. Thereafter, the fifth mask is formed upon the assembly and the memory gate window MGW is formed therein, as shown in FIG. 4D.

Figure 4E:
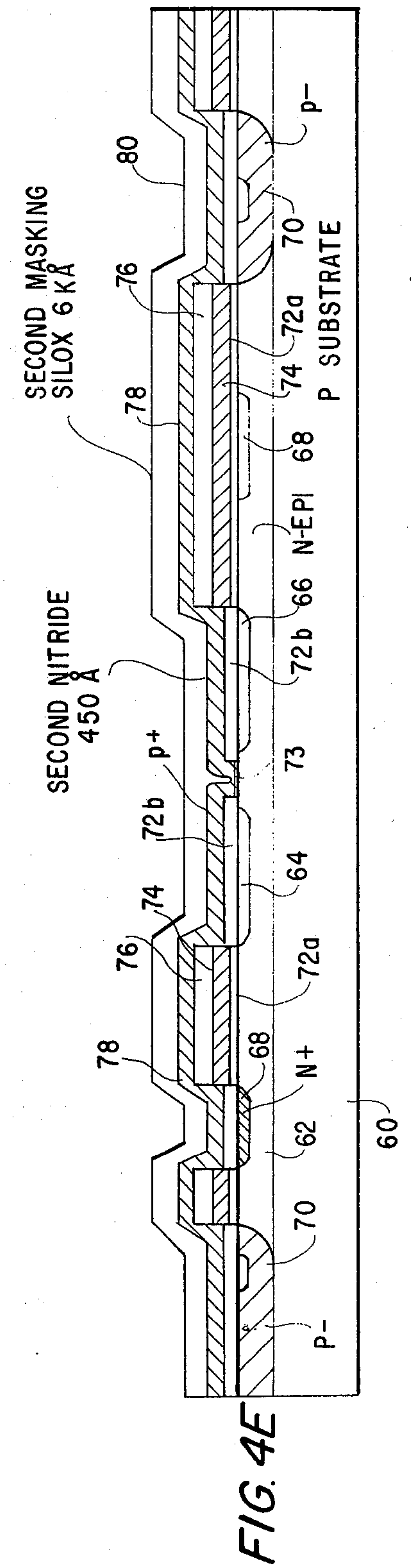
Figure 4F:
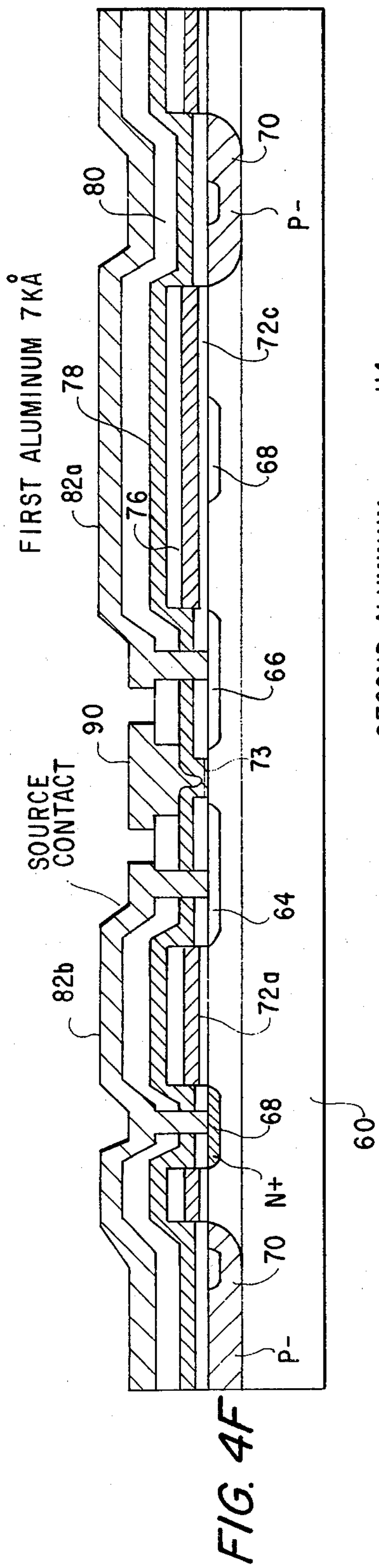
Figure 4G:
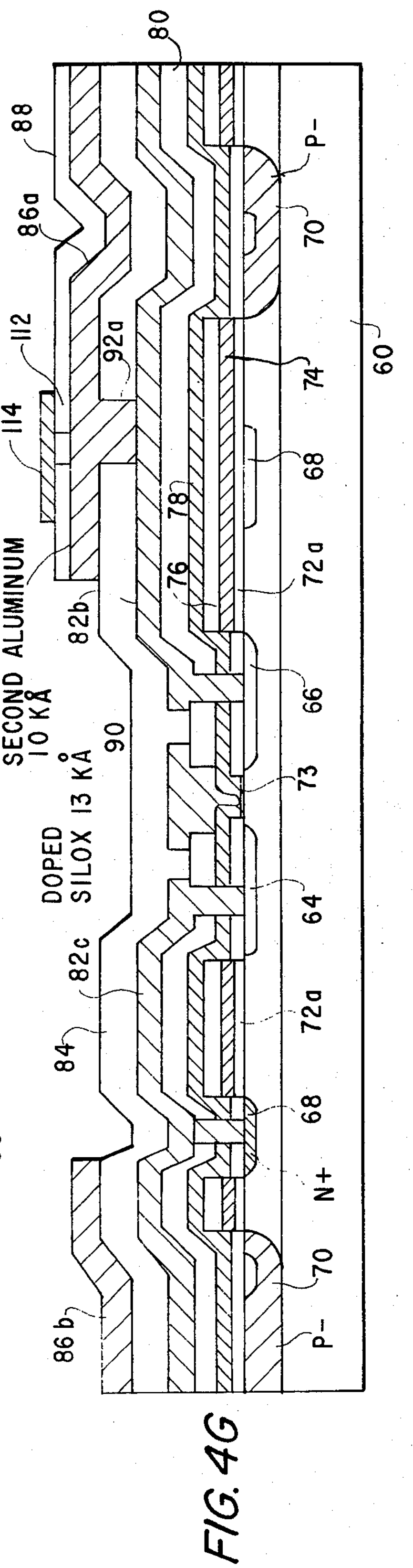

FIGS. 4E to 4G represent particularly a method of fabricating a-memory MNOS element, wherein a very thin second oxide layer 73 is disposed over the memory gate region between the surface of the epitaxial layer 62 and the second nitride layer 78 deposited through the memory gate window MGW (see FIG. 4D). In one illustrative method of forming the very thin oxide layer 73 in the region of the memory gate region, the second oxide layer 72*b* may be etched with suitable solutions well-known in the art, to a desired depth in the order of 6 to 9 A. As will be subsequently explained in detail with respect to FIG. 4E, a second nitride layer 78 is deposited over the second oxide layer 72*b*, thereby increasing the thickness of the oxide layer in the region of the memory gate to a thickness in the order of 10 to 30 A, whereby a memory MNOS element is provided. By contrast, in the fabrication of a non-memroy MNOS element, the relatively thick second oxide layer 72 remains in the order of 400 to 1,400 A thick; in an illustrative embodiment of this invention, the layer 72*b*, as shown in FIG. 2, was formed to a thickness of 500 A.

Next, as shown in FIG. 4E, the second nitride ($Si_3N_4$) layer 78 is deposited to a depth of 400 A, whereby a nitride-oxide interface charge $N_I$ is established in the order of $10^{11}$ at the interfacing surface between the nitride layer 78 and the silicon dioxide layer 72*b*, so that the operation of the non-memory MNOS FET therebeneath is not adversely effected. As explained above with respect to fabricating a memory MNOS element, the deposition of the second nitride layer 78 does increase the thickness of the oxide layer 72*b* in the region of the memory gate. Illustratively, the nitride layer 78 may be deposited at a rate in the range of 75 A to 150 A/minute and in one embodiment at the rate of 100 A/-minute at a temperature of 750°C. The criteria for selecting the rate of deposition of the second nitride layer 78 will be explained in detail later.

In the fabrication of a memory MNOS element, the gate oxide layer 73 is made sufficiently thin, in the range of 10 A to 30 A, such that charges may be tunnelled between traps at the nitride-oxide interface and the epitaxial layer 62. In order to form this very thin silicon dioxide layer 73, the formation of the residual oxide during the chemical cleaning procedures prior to the nitride deposition is minimized. This is done in the following manner. The cleaning procedure involves the use of heated sulphuric acid (≈180°C) to clean residual contaminants from the surface of the epitaxial layer surface above the source and drain regions 64 and 66. During this sulphuric acid cleaning procedure, a chemical oxide of 30 to 50 A is formed. The next step is to etch the epitaxial layer surface in a dilute solution of hydroflouric acid (HF) and water (1.0 solution). The dilute HF solution removes the chemically formed oxide and, at the same time, removes a small amount of the thicker oxide in the non-memory portions of the structure. After rinsing in deionized water, a nascent or residual oxide on the silicon is formed and it has been measured by ellipsometry to be 7 to 9 A thick. This thin residual or nascent oxide is not the final tunnelling oxide thickness, but it is the thickness of the gate oxide layer 73 prior to the deposition of the nitride layers 78. After the semiconductive structures are etched in a dilute HF solution and then rinsed in water, the structures then are put into a high-capacity vertical reactor using an RF heated susceptor. The silicon nitride layer 78 is then deposited by the irreversible pyrolytic decomposition of silane ($SiH_4$) in the presence of anhydrous ammonia ($NH_3$). The anhydrous ammonia, however, still contains a residual, very small percentage of water and during the nitride deposition, the 7 to 9 A of nascent oxide is increased to approximately 10 to 30 A. Interface modification of the thin gate oxide layer 73 is accomplished by using an additional non-oxidizing atmosphere during the heat-up cycle, prior to nitride deposition. For example, the wafers are heated to 700°C to 850° C in either high-purity nitrogen or high-purity hydrogen. The use of these different gases does change the memory characteristics to some degree. The final thin gate oxide thickness 73 is determined by the temperature (e.g. 700°C to 850°C) of the silicon nitride deposition process and by the water content (e.g. 0.001 percent) of the ammonia used for the nitride formation. The memory gate oxide layer 73 is 10 to 30 A thick after the second silicon nitride deposition. The thickness of the second nitride layer 78 typically is 375 A. The nitride layer 78 formed by this process is a very low-conductivity nitride, and its optical dielectric constant has been measured to be very close to 2.

The ammonia/silane ratio during the first and second nitride depositions is greater than 300:1. It has been found low-conductivity that the nitride conductivity changes for ammonia/silane ratios less than 300:1. If the ammonia/silane ratio is maintained greater than that number, there remains a very low-conductivity insulating film, this being desired in an MNOS device. The amount of charge at the nitride-oxide interface, appearing to be a fixed charge, is effected by the deposition rate, the deposition rate being controlled by the flow rate or the total amount of silane present in the system. Thus, by maintaining constant the ammonia/silane ratio, but increasing the percentage of silane present in the system, the nitride deposition rate is controlled.

Thereafter, a second silox layer 80 is deposited to an undensified depth $X_{ox}$ = 10 KA, and upon further processing provides a layer 80 of a thickness in the order of 6 to 7 KA. This silicon dioxide layer 80 is used as a mask during the etching and removal of the second silicon nitride layer 78.

With regard to FIG. 4F, masks 6 and 7 are next formed whereby the contact window CW and the gate window DW are formed through the insulating layer 80. Thereafter, the first metal deposition is carried out, using standard vacuum deposition techniques, to dispose a suitable metal such as aluminum or an alloy of aluminum and copper upon the silox layer 80, as shown in FIG. 4F. Thereafter, an eighth masking operation is performed for defining the electrical connections at the first level, whereby portions of the aluminum layer may be removed to provide the conductive strips 82*a*, 82*b*, 82*c* and 82*d* (see FIGS. 2 and 4F).

As shown in FIG. 4G, a third silox masking layer 84 is deposited to a depth $X_{ox}$ = 13K ± 2K and is doped with phosphorous. The phosphorous dopant is used to match the temperature coefficients of the nitride and aluminum layers to avoid cracking. Thereafter, a ninth masking process is carried out to define the windows for forming the via's 92a through the third silox layer 84. Thereafter, a second metal deposition of aluminum is carried out to a depth $X_{AL}$ = 10K ± 1K. Thereafter, a tenth masking step is performed to form the electrical connections at the second level, whereby selected portions of the aluminum layer are removed to form the conductive strips 86*a* and 86*b*. Then, the top or exterior oxide layer 88 is formed over the entire assembly to provide a protective covering from the environment. Illustratively, the top oxide layer 110 is formed a depth of 13K ± 2KA and is phosphorous doped, to provide temperature coefficients matching with contact pads 114 to be formed thereon. Next, the eleventh masking step is carried out to form via windows 112 through the top oxide layer 88, whereby contact pads 114 may be formed of a suitable electrically-conductive material such as aluminum or an alloy of aluminum and copper upon the exterior surface of the layer 110 to provide contact pads for exterior electrical connection to the second set of conductive strips 86.

Figure 5:
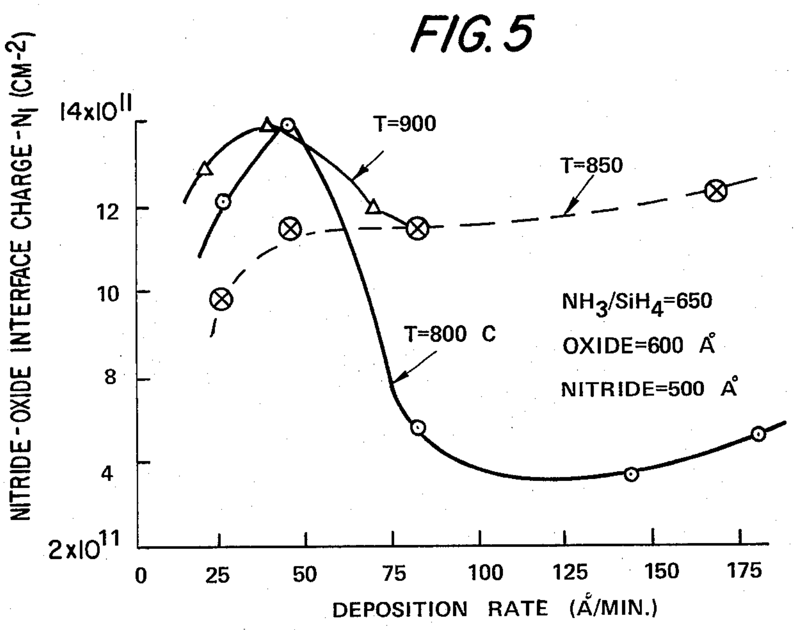
FIGS. 5 and 6 show, respectively, graphs representative of the nitride-oxide interface charge deposited at varying rates, for a non-memory and a memory elemet.
Figure 6:
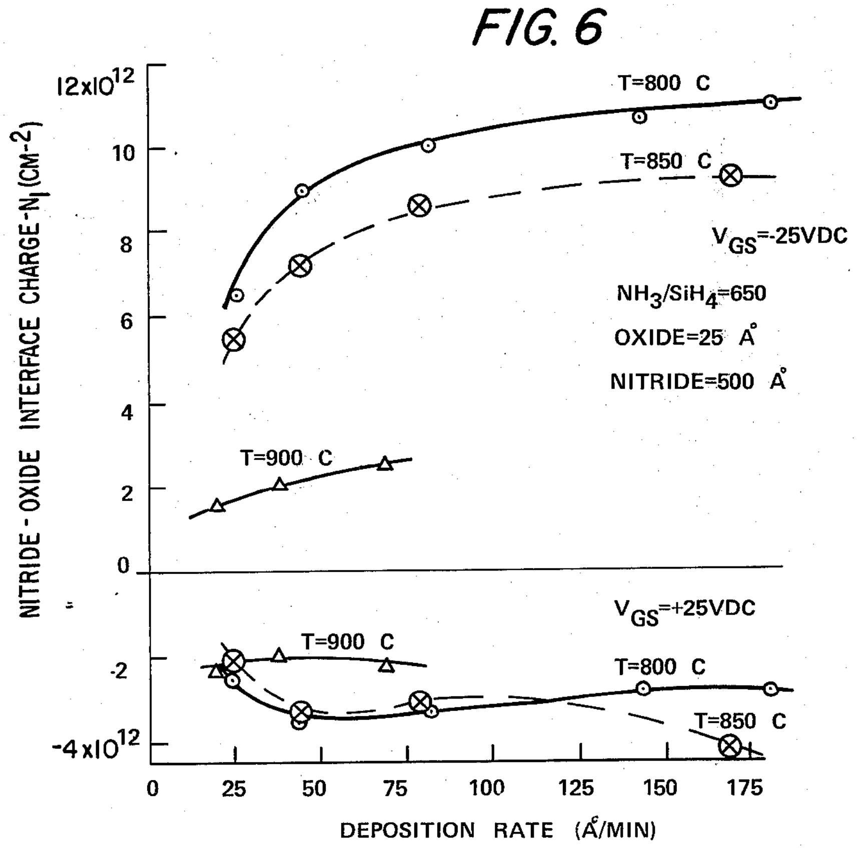

There is shown in FIGS. 5 and 6 the measured nitride-oxide interface charge density $N_I(cm^{-2})$ versus the nitride deposition rate, for non-memory and memory devices, respectively. The MNOS memory and non-memory devices closely resemble each other, differing primarily in the thickness of their gate silicon oxide layer; in particular, the gate silicon oxide layer of the non-memroy element has a thickness $X_{ox}$ = 600 A and is schematically represented in FIG. 2 as the layer 72*b*; the nitride layer 78 of such a non-memory element has a thickness $X_{ox}$ = 500 A. It is noted that the relative dimensions as shown in FIG. 2 do not represent the actual dimensions or are in proportion to each other. The curves of FIG. 5 represent charge density versus nitride depositions characteristics for such a non-memory MNOS element. By contrast, the curves of FIG. 6 relate to the nitride-oxide interface charge of an MNOS memory device wherein the gate silicon oxide layer 73 has a thickness $X_{ox}$ approximately equal to 25 A accompanied by a nitride layer of a thickness $X_n$ = 500 A.

With regard to FIG. 5, it is seen that the nitirde-oxide interface charge NI for the non-memory element is strongly dependent upon the deposition rate, as well as temperature, having a broad minimum $N_I$min occurring in the range of 75 A to 150 A; this broad range was also found to occur at the lower temperatures, as indicated in FIG. 5, for ammonia/silane ($NH_3/SiH_4$) ratios greater than 300:1. As further shown, the nitride-oxide interface charge $N_I$ does increase to a maximum greater than $10^{12}$ $cm^{-2}$ at deposition rates near 40 A/-minute and 250 A/minute. The resultant threshold voltage of such MNOS transistors with a P-type substrate, is in the order of −2 V to −3 V.

With respect to FIG. 6, there are shown a first set of curves indicating the charge saturation limits for a gate-to-substrate bias $V_{GS}$ in the order of +25 DC to provide a negative charge stored on the gate memeory in the order of $-3(10^{12})cm^{-2}$, and a second set of curves where the gate voltage $V_{GS}$ is set at −25 DC, providing an increasing nitride-oxide interface charge $N_I$ of a value in the order of $+10^{13}$ $cm^{-2}$ as the deposition rate is increased. The memory hysteresis window of the memory MNOS device, is the difference between the positive and negative saturation levels, as represented by the first and second sets of curves of FIG. 6. The memory hysteresis window tends to increase as the temperature at which the nitride deposited decreases; this effect may be attributable to an increase in the trap density near the nitride-oxide interface and/or small changes in the nitride conductivity. The curves as shown in FIGS. 5 and 6 are more fully discussed in an article entitled "The Effect of $Si_3N_4$ Deposition Rate on Oxide-Nitride Interface Charge," by J. R. Cricchi, P. R. Reid, and R. M. McLousky, submitted to the Electrochemical Society Meeting, Oct. 8–13, 1972.

With respect to FIG. 5, it is seen that a maximum nitride-oxide interface charge $N_I$ $cm^{-2}$ and therefore increased parasitic voltage is achieved with nitirde deposition rates of 40 to 60 A/minute and of in excess of 200 A/minute. Thus, in a manner as explained above, the first nitride layer 74 that is disposed over the first region, i.e. that region other than the area in which the MNOS device is formed, is deposited at a rate in the ranges and in particular at a preferred rate of 40 A/minute, whereby a maximum nitride-oxide interface charge of 1.4 ($10^{12}cm^{-2}$) is formed to inhibit the formation of a parasitic region within the epitaxial layer 62 and to increase the resultant parasitic voltage. As a result, the rate deposition of nitride to form the first nitride layer, as explained with respect to FIG. 4C, is chosen in accordance with this range.

The rate at which the second nitride layer 78 is deposited, is selected, as will now be explained with respect to FIGS. 5 and 6. In this regard, it is understood that both memory and non-memory MNOS elements are fabricated in accordance with the method of this invention and may be fabricated upon a common semiconductive assembly, such as shown in FIGS. 1A and 1B and as more fully described in the above-identified, co-pending application Ser. No. 437,649. In particular, a memory and non-memory device may be formed simultaneously upon a common substrate or wafer by selectively controlling the rate at which the second nitride layer 78 is deposited. With respect to FIGS. 5 and 6, it is seen that a deposition reate in the order of 100

A/minute provides a nitride-oxide interface charge for a non-memory structure in the order of $4 \times 10^{11}cm^{-2}$, whereby the normal operation of an MNOS FET is minimally effected by such a charge. As seen in FIG. 6, the resultant charge established in the memory MNOS with a nitride layer deposited at a rate of 100 A/minute is in the orders of $-3 \times 10^{12}cm^{-2}$ with a $+25$ - $V_{GS}$ applied across the memory gate and of $+10^{13}cm^{-2}$ with a $V_{GS}$ of $-25$ applied across the memory gate. In other words, the low threshold state of the MNOS memory element corresponds to the establishment of the negative charges as shown in FIG. 6, and the high threshold state corresponds to the establishment of the positive charges. Thus, a maximum memory hysteresis window is achieved when the second nitride layer 78 is deposited at a rate in the board range of 75 to 125 A/minute. In order to achieve optimum characteristics for both the memory and non-memory MNOS elements during a simultaneous deposition of the second nitride layer, a nitride deposition rate of approximately 100 A/minute is selected, based on the condiseration of achieving the maximmum memory hysteresis window and for minimizing the formation of the nitride-oxide interface charge.

Thus, there has been disclosed above a structure and a method for the structure whereby a plurality of MNOS elements may be formed upon a substrate so as to inhibit the formation of parasitic regions between MNOS memory and non-memory elements. In particular, a first nitride layer is deposited across portions of the semiconductive structure in which it is desired to inhibit the formation of parasitic regions. In such portions, the nitride layer is deposited at a rate whereby a nitride-oxide interface charge is created of a polarity opposing the formation of a parasitic region within the semiconductive substrate therebeneath. In the formation of an MNOS device such as an FET, a second nitride layer is disposed over a surface covering the source and drain regions of the MNOS device, at a rate such that a minimum nitride-oxide interface charge is formed, whereby the normal FET gate control may be carried out. Such a structure and technique is particularly adapted to use in a matrix array of MNOS memory elemets disposed in rows and columns, wherein the memory elements are interconnected by first and second sets of conductive strips disposed at right angles to each other. In such a matrix memory, it is necessary to provide insulation between the first and second sets of conductive strips and to minimize the step height of the insulation there-between, thus ensuring the the conductive strips will be deposited through the windows in the various insulation layers to make positive electrical contact with the regions within the MNOS memory element.

In accordance with teachings of this invention, an MNOS element is provided having a parasitic threshold voltage of greater than 40 V. The thickness of its insulating layers (i.e. layers 72*a*, 74, 76, 78 and 80) inserted between an epitaxial layer and a first, conductive element is in the order of 10 KA to 12 KA, a significant decrease over the insulating layer thickness used in the prior art. In spite of the total insulating layer thickness of 10 KA to 12 KA, the approximate step height presented to the aluminum layer 82*b* is still only the thickness of the deposited oxide layer 76, i.e. 6 KA. As a result, the continuity of the aluminum layer and therefore the efficient electrical contact with the regions of the MNOS element is enhanced. Further, this invention provides a simplified method of fabricating non-memory and memory MNOS elements, wherein the second nitride layers of each are deposited simultaneously to ensure the optimum characteristics of both the memory and non-memory elements.

Numerous changes may be made in the above-described apparatus and the different embodiments of the invention may be made without departing from the spirit thereof; therefore, it is intended that all matter contained in the foregoing description and in the accompanying drawings shall be interpreted as illustrative and not in a limiting sense.

What is claimed is:

1. A semiconductive structure comprising:

a. a semiconductive member of a first conductivity type, having a surface;

b. first and second regions disposed within said surface of said semiconductive member and formed of a second conductivity type material opposite to that of said first conductivity type, said first and second regions being spaced from each other and defining a second portion of said surface of said semiconductive member;

c. a first silicon oxide layer disposed over a first, further portion of said surface of said semiconductive member;

d. a second silicone oxide layer disposed to cover said second portion of said surface;

e. third and fourth layers of silicon nitride or aluminum oxide deposited respectively over said first and second silicon oxide layers;

f. a first conductive element disposed in intimate electrical contact with that portion of said fourth nitride layer covering at least a part of said semiconductive member intermediate said first and second regions, thus permitting the formation of a channel therebetween in response to the application of a signal to said first conductive element, said fourth layer being deposited at a rate and at a temperature to provide a minimal interface charge at the interface surface between said second silicon oxide layer and said fourth layer; and g. a second conductive element disposed through a window within said second silicon oxide layer and said fourth layer to form an intimate electrical contact with one of said first and second regions of said member and disposed to overlie said third layer, said third layer deposited at a rate and at a temperature to provide a maximum interface charge at the interface surface between said first silicon oxide layer and said third layer, of a polarity to inhibit the formation of a parasitic region beneath said second conductive element upon the application of a signal to said second conductive element.

2. The semiconductive structure as claimed in claim 1, wherein said first and second regions form, respectively, the source and drain regions of an MNOS device comprising said second conductive element for controlling the impedance presented in said channel within said member between said source and drain regions.

3. The semiconductive structure as claimed in claim 2, wherein said first conductivity type is N and said second conductivity type is P.

4. The semiconductive structure as claimed in claim 1, wherein said semiconductive member comprises an epitaxial layer.

5. The semiconductive structre as claimed in claim 1, wherein said fourth layer also is disposed over said third layer and the combined thicknesses of said third and fourth layers is less than 6,000 A.

6. The semiconductive structure as claimed in claim 5, wherein there is included a fifth insulating layer deposited over said second conductive element, and a third conductive element is disposed over said fifth insulating layer, and means for making electrical contact through a window of said fifth insulating layer between said second and third electrically conductive elements.

7. The semiconductive structure as claimed in claim 1, wherein said first and second regions are, respectively, source and drain regions of an MNOS memory element, and said second silicon oxide layer has a thickness in the order of 10 to 30 A.

8. A memory system comprising a plurality of said MNOS memory elements as claimed in claim 7, disposed in rows and columns, said first conductive elements being disposed along said rows whereby signals may be applied to the gates of said MNOS memory elements, and there is included a plurality of third conductive elements disposed along said columns to provide means for applying signals to one of said source and drain regions, and a fifth insulating layer disposed between said third and second conductive elements.

9. The memroy system as claimed in claim 8, wherein each of said second conductive elements is disposed over said fourth layer, each of said source and drain regions of a plurality of said MNOS memory elements in a column forming a common region disposed along said column, and means for making an electrical connection between said third and second electrically-conductive strips through said fifth insulating layer.

10. The memory system as claimed in claim 9, wherin the number of electrical connection means is less than the number of MNOS memory elements in that column of said memory system.

11. A semiconductive structure as claimed in claim 1, wherein said fourth layer is of silicon nitride and is deposited at a rate in the range of 75 to 150 A/minute.

12. A semiconductive structure as claimed in claim 1, wherein said third layer is of silicon nitride and is deposited at a rate in the range of 40 to 60 A/minute and in excess of 200 A/minute.

13. A semiconductive assembly incorporating a first, memory MNOS device and a second, non-memory MNOS device, said semiconductive assembly comprising:

a. a common substrate including a semiconductor member of a first conductivity type, haveing a surface;
b. first and second regions disposed within said surface of said semiconductor member to form said first memory MNOS device and formed of a second conductivity type opposite to that of said first conductivity type;
c. third and fourth regions disposed within said surface of said semiconductive member to form said second, non-memory MNOS device, and formed of a second conductivity type opposite to that of said first conductivity type, said first and second regions and said third and fourth regions spaced from each other respectively and defining together a second portion of said surface of said substrate;
d. a first silicon oxide layer disposed over a first, further portion of said surface of said substrate;
e. a second silicon oxide layer disposed over said second portion of said surface;
f. third and fourth layers of silicon nitride or aluminum oxide deposited, respectively, over said first and second silicon oxide layers;
g. first and second conductive elements disposed, respectively, in intimate electrical contact with those portions of said fourth layer covering at least a part of said surface intermediate each of said first and second regions, and of said third and fourth regions;
h. said fourth layer deposited at a common rate and temperature to provide a minimal interface charge at the interface surface between said second silicon oxide layer and said fourth layer, thus permitting the formation of a channel between said first and said second regions of said first memory MNOS device and between said third and fourth regions of said second, non-memory MNOS device and to provide a maximum memory hysteresis characteristic for said first memory MNOS device;
i. third and fourth conductive elements disposed through windows within said second silicon oxide layer and said fourth layer to form intimate electrical contacts respectively with one of said first and second regions of said first, memory MNOS device and with one of said third and fourth regions of said second, non-memory MNOS device, said third and fourth conductive elements disposed to overlie said third layer, said third layer deposited at a rate and temperature to provide a maximum interface charge at the interface surface between said first silicon oxide and said third layer, of a polarity to inhibit the formation of parasitic regions beneath said third and fourth conductive elements upon the application of a signal thereto.

14. The semiconductive assembly as claimed in claim 13, wherein said fourth layer is of silicon nitride and is deposited at a common rate in the order of 100 A/minute.

15. A semiconductive structure comprising:

a. a semiconductive member of an N-type conductivity, having a surface;
b. first and second regions disposed within said surface of said semiconductive member and formed of a P-type conductivity material, said first and second regions being spaced from each other and defining a second portion of said surface of said semiconductive member;
c. a first silicon oxide layer disposed over a first, further portion of said surface of said semiconductive member;
d. a second silicon oxide layer disposed to cover said second portion of said surface;
e. third and fourth silicon nitride layers deposited respectively over said first and second silicon oxide layers;
f. a first conductive element disposed in intimate electrical contact with that portion of said fourth layer covering at least a part of said semiconductive member intermediate said first and second regions, thus permitting the formation of a channel therebetween in response to the application of a signal to said first conductive element, said third layer being deposited at a rate and at a temperature to provide a minimal nitride-oxide interface charge at the interface surface between said second silicon oxide layer and said fourth layer; and g. a second conductive element disposed through a window within said second silicon oxide layer and said fourth layer to form an intimate electrical contact with one of said first and second regions of said member and disposed to overlie said third layer, said third layer deposited at a rate and at a temperature to provide a maximum nitride-oxide interface charge at the interface surface between said first silicon oxide layer and said third layer, of a polarity to inhibit the formation of a parasitic region beneath said second conductive element upon the application of a signal to said second conductive element.

* * * * *